United States Patent [19]

Lymn

[11] Patent Number: 5,222,650
[45] Date of Patent: Jun. 29, 1993

[54] SOLDER LEVELLER

[76] Inventor: Peter P. A. Lymn, Limeworks Cottage, Kiln Lane, Buriton, Petersfield, Hampshire, United Kingdom

[21] Appl. No.: 854,657

[22] PCT Filed: Nov. 2, 1990

[86] PCT No.: PCT/GB90/01685
§ 371 Date: Apr. 30, 1992
§ 102(e) Date: Apr. 30, 1992

[87] PCT Pub. No.: WO91/06390
PCT Pub. Date: May 16, 1991

[30] Foreign Application Priority Data
Nov. 3, 1989 [GB] United Kingdom ............... 8924870

[51] Int. Cl.$^5$ ........................................... B23K 1/00
[52] U.S. Cl. ........................................ 228/20; 228/37; 228/254; 118/63
[58] Field of Search .............. 228/20, 37, 46, 125, 228/254, 260; 118/63; 427/349

[56] References Cited

U.S. PATENT DOCUMENTS

| | | | |
|---|---|---|---|
| 4,402,448 | 9/1983 | O'Rourke | 228/20 |
| 4,921,156 | 5/1990 | Hohnerlein | 228/37 |
| 4,928,869 | 5/1990 | Lymn | 228/20 |

FOREIGN PATENT DOCUMENTS

| | | |
|---|---|---|
| 0109256 | 6/1984 | European Pat. Off. . |
| 1527412 | 2/1969 | Fed. Rep. of Germany . |
| 8707196 | 3/1987 | PCT Int'l Appl. . |

*Primary Examiner*—Samuel M. Heinrich
*Attorney, Agent, or Firm*—Ware, Fressola, Van der Sluys & Adolphson

[57] ABSTRACT

A horizontal solder leveller for applying solder to a board comprises: means $15_u, 15_1, 16_u; 16_1; 17_u, 17_1$ including a solder bath 1 for applying molten solder 2 to a board. means 47 for levelling solder applied to the board, including nozzles for directing solder-levelling air jets at the board, and means $19_u, 19_1, 48$ for creating a dispersion of oil in an air stream from the levelling means, the oil dispersion means being provided between the solder applying means and the levelling means.

21 Claims, 10 Drawing Sheets

SOLDER LEVELLER

The present invention relates to a horizontal solder leveller.

The term "horizontal solder leveller" means a machine through which printed circuit boards and the like (hereinafter called "boards") are passed substantially horizontally for application of molten solder and levelling of the applied solder. Accordingly such a machine comprises at least means for applying molten solder and means for levelling the applied solder. A horizontal solder leveller is described in specification No: WO 87/07196, published on 3rd Dec., 1987, of my international patent application No: PCT/GB 87/00367.

Where the solder levelling means are so called "air knives", i.e. nozzles for directing air jets at a board having its solder levelled, molten solder blown from a board during levelling forms solid particles which are blown in the general direction of the solder application means. However considerable quantities of the particulate solder are liable to form unwanted deposits on various parts of the machine. These deposits are inconvenient and must be removed periodically.

It is conventional in solder levelling to apply oxidation inhibiting oil to boards being tinned, since this is known to improve the quality of the tinning. In the machine of my earlier mentioned patent application the oil was applied by passing the board through a layer of oil overlying molten solder in a solder bath.

Operation of the earlier machine left room for improvement as regards unwanted solder deposits and quality of tinning. The object of the present invention is to improve these factors-not only in my earlier machine, but generally in horizontal solder levellers. To this end, I now provide a dispersion of oil in the air flow from the air knives. The dispersion intermixes with the blown solder and causes, I believe, collision of solder particles with oil droplets which act to decelerate the solder blown from the board by the air knives and to coat the solder particles with oxidation inhibiting oil. Further, it keeps the machine generally covered in oil which deters solder particles from adhering to parts of the machine.

Accordingly a horizontal solder leveller of the present invention comprises:

means including a solder bath for applying molten solder to a board;

means for levelling solder applied to the board, including nozzles for directing solder—levelling air jets at the board; and means for creating a dispersion of oil in an air stream from the levelling means, the oil dispersion means being provided between the solder applying means and the levelling means.

Preferably the solder leveller includes a pump for directly or indirectly pumping oil to the means for creating an oil dispersion.

The oil dispersion means may take various forms. It may comprise a pipe having oil dispersion nozzles from which a spray or curtain of oil is pumped directly into the airstream. This may be up- or down-stream of or at an outfeed roller pair between the solder applying and solder levelling means. One, other or both of the outfeed rollers is preferably castellated for passage of air through it.

It is not necessary for the oil to be pumped to the airstream. In the preferred embodiment, the lower one of the outfeed rollers is at least partially immersed in an oil bath and both of these rollers are castellated, that is to say has a series of smaller diameter portions between full diameter portions. These rollers are constantly wetted with oil from the oil bath, and the castellations or at least the gaps between them, provide passages for air from air knives in the levelling means. When the air knives are actuated—preferably intermittently—the air flow strips oil from the rollers to form the dispersion of it in air. Thus the oil is blown onto the board as it leaves the solder applying means and onto the machine generally. The solder spray particles from the air knives encounter oil droplets and lose momentum and/or encounter parts of the machine which are thus oiled and the solder does not adhere to the parts. In the preferred embodiment, the solder application means includes a bath of molten solder to which most of the solder particles return.

In the preferred embodiment, a cowl is provided over the solder bath to direct the dispersion of oil and the solder particles back into the bath.

I believe that the effect of the invention in the preferred embodiment is more than merely providing a convenient passage via the castellations for the solder particles entrained in the levelling air. Provision of the oil dispersion upstream of the levelling air knives, causes oil blown from the castellated rollers as a dispersion to have the general effect of keeping the machine clean of solder. Further, it is likely that the blown oil itself contributes to levelling of the solder on the board.

In accordance with a particular feature of the preferred embodiment, the solder leveller includes:

a gutter for draining oil from the oil bath to an oil tank, a further weir in a wall of the oil bath to control the oil level therein to be below that of the weir between the solder bath and the oil bath, a solder aperture in the oil bath wall beneath the further weir for draining solder from the oil bath, and a cage in the gutter around the solder aperture to contain solder flowing out of the aperture with a top edge higher than the solder aperture, whereby solder contained by the cage fills the aperture and closes it to oil flow.

In the preferred embodiment, the solder leveller includes means for changing the inclination of the board as it leaves the levelling means from a substantially horizontal or upwards inclination to a downwards inclination.

The inclination changing means is particularly useful where as in the preferred embodiment the board leaves the solder applying means whilst travelling upwardly.

Conveniently, the inclination changing means changes the inclination of the levelling means to match the downwards inclination of the board whilst still at the levelling means. In the preferred embodiment, downwards inclination of outfeed rollers between the applying means and the levelling means is changed also. Preferably, the inclination changing means includes an air table along which the board travels downstream of the board whilst still at the levelling means, the inclination of this also changing.

According to another aspect of the invention there is provided a horizontal solder leveller comprising:

means including a solder bath for applying molten solder to a board;

means for levelling solder applied to the board, including nozzles for directing solder-levelling air jets at the board; and means for changing the inclination of the board as it leaves the levelling means from a substantially horizontal or upwards inclination to a downwards inclination.

To help understanding of the invention, a specific embodiment thereof will now be described by way of example and with reference to the accompanying drawings in which.

Figure 1:
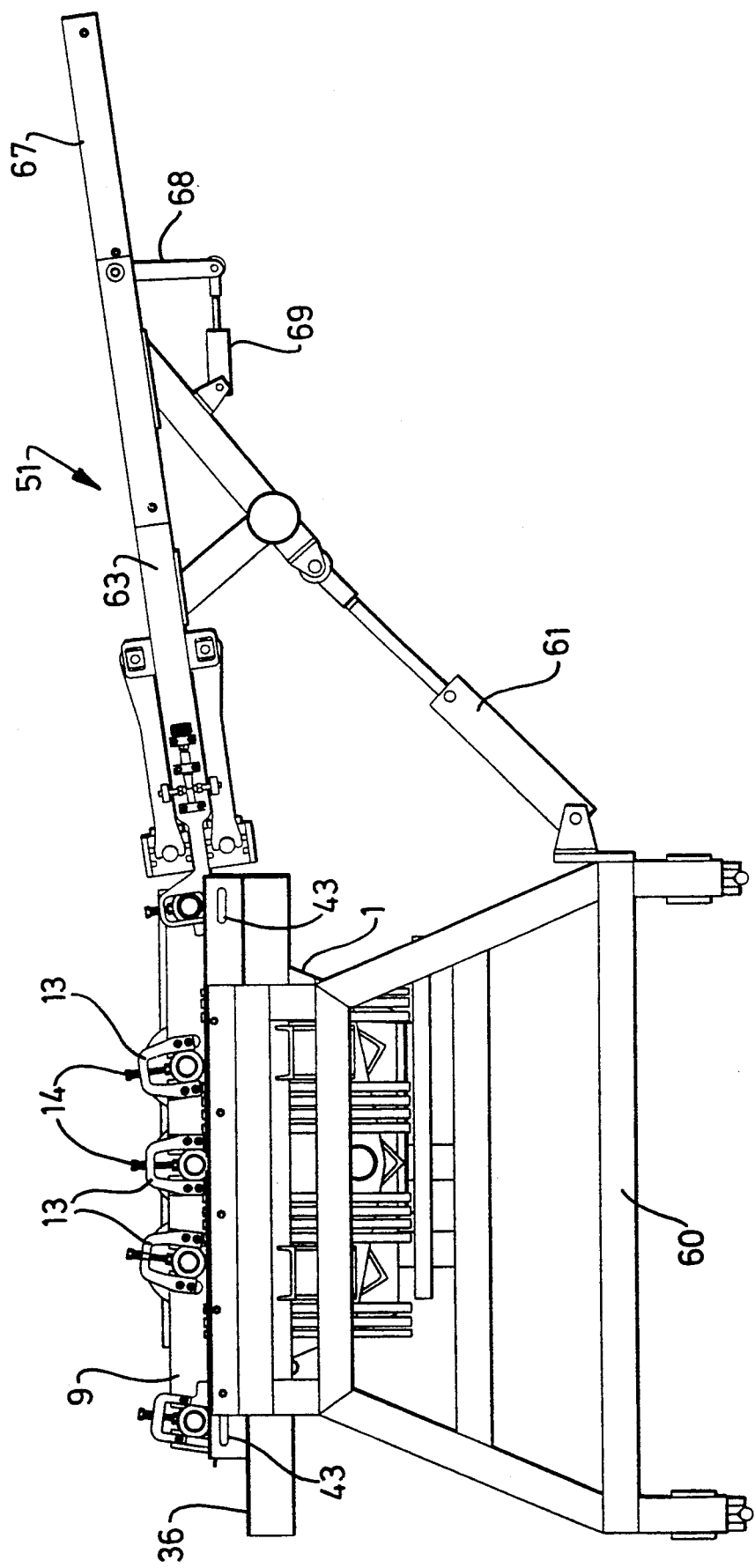
FIG. 1 is a front view of a solder leveller of the invention.
Figure 2:
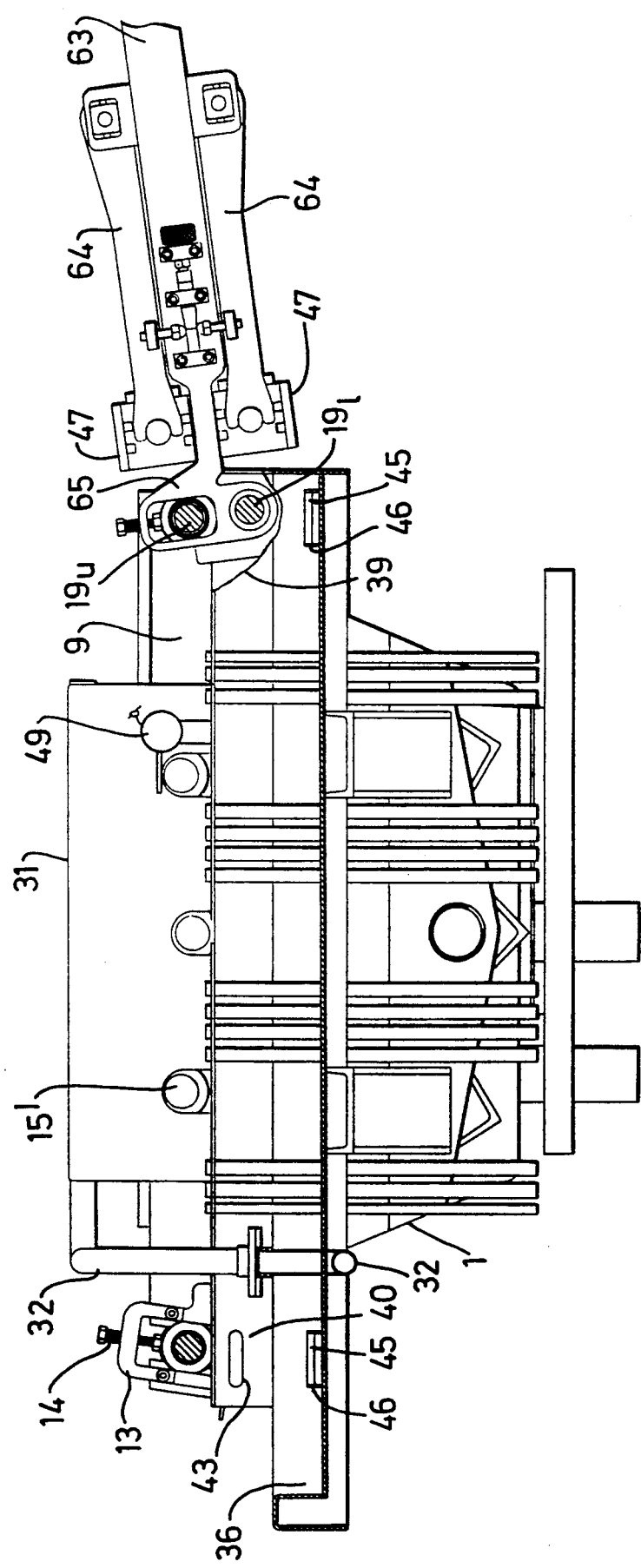
FIG. 2 is a cross-sectional view similar to that of FIG. 1 taken on the line II—II in FIG. 4, on a larger scale with various components omitted.

Referring initially to FIGS. 1 to 4 of the drawings, the solder leveller has a steel bath 1 for solder 2, which is heated by electric elements 3. These pass through a back rim 4 of the bath 2 and close inside a back wall 5, across and immediately above the bottom wall 6 of the bath, close inside the front wall 7 and through a front rim 8 of the bath. Spaced inwards of the heating elements 3 adjacent the back and front walls 5,7 are front and back roller support plates 9. The plates have indentations 10 for their support on top edges 11 of up- and down-stream end walls 12 of the bath 1. Rollers are mounted between the support plates 9. The rollers comprise three pairs of tinning rollers $15_u,15_1$; $16_u,16_1$; $17_u,17_1$; one pair of upstream/infeed guide rollers $18_u,18_1$ and one pair of downstream/outfeed guide rollers $19_u,19_1$. The lower rollers are fixedly journalled in the side plates 9, whilst the upper rollers are journalled in a manner to be movable away from the lower rollers, but biased theretowards by their weight. The upper rollers run in bearing blocks movable within fixed horse-shoe members 13. Springs 14 act between the top of these members and bolts fixed in the bearing blocks to relieve part of the weight of the upper rollers, so that they do not compress a board in the nip of the rollers.

The nips of the rollers define a curved board path 20 through the bath. The nips of the tinning rollers are all beneath the solder level 21—which is just below the top edges 11 of the end walls 12 of the solder bath. In use these top edges are level and act as oil weirs. The upper rollers are ganged together for rotary drive, in a manner which is not shown, via forward ends 15', 16', 17' of drive shafts integral with the rollers. The upper and lower tinning rollers carry at their front ends gear wheels 23 for coupling the lower rollers—for their drive—to the upper rollers. Adjacent the gear teeth at the front end of the rollers and at the rear end of the tinning rollers, they are provided with tyred upper and plain lower wheels 24 having a slightly larger diameter than their rollers and allowing the unrelieved weight of the upper tinning rollers to be carried on the lower rollers to provide a small gap between the tinning rollers—just less than the thickness of the thinnest of the boards to be tinned. The infeed and outfeed rollers are driven by forward ends 18', 19' of the upper ones $18_u$, $19_u$. These rollers are geared together at their back ends.

Solder circulation arrangements will now be described. Solder flow is shown by chain-dotted arrows in FIG. 4. Immediately above the centre of the bottom wall 6 of the bath, a steel pipe 25 passes through the back wall 5 towards the front wall 7. A non-shown cross-pipe having a series of forwards facing nozzles and connected to the front end of the pipe 25 close below the front roller-support plate 9 allows solder to flow into the space between the front wall 7 and the front support plate 9. At the solder level 21, both support plates 9 have a series of apertures 27, which allow passage of solder. The apertures are interspaced in the direction of the board path 20 in line with the gaps between the tinning rollers. The arrangement is such that solder, heated by the elements 3 extending there, wells up from the cross-pipe between the front wall 7 and the front support plate 9. It then passes through the apertures 27 in the front plate 9 across the upper region of the bath between the tinning rollers, through the apertures in the back plate 9 and out of the bath via a weir 28 cut in the back wall 5. A solder tank 29 is welded to the back wall 5 at the weir. The solder circulation just described urges any dross floating on the solder to collect in the tank 29. For circulation, a pump—not shown—is provided at a bottom outlet 30 from the tank 29 to the pipe 25. Solder in the lower region of the solder bath is not circulated directly by the pump, but is mixed by rotation of the lower tinning rollers $15_1,16_1,17_1$.

Oil circulation arrangements will now be described. Oil flow is shown by full arrows in FIG. 4. An oil cover 31 (see FIG. 2) over the gear wheels 23 of the upper tinning rollers is supplied with oil via a pipe system 32. Oil is able to spill out of shaft apertures in the cover 31 onto the solder 21. Fabricated on the up- and downstream end walls 12 of the solder bath are oil baths 34,35 in which the lower guide rollers $18_1,19_1$ run. Oil passes to the baths 34,35 over the top edges 11 of the end walls which in effect form weirs. The back and front walls 5,7 are higher to contain the oil. A gutter 36 extends along the front walls 39,7,40 of the downstream oil bath 35, the solder bath 1 and the upstream oil bath 34 respectively, along the upstream side 41 of this latter bath and around to its back end 42. Weir slots 43 are provided in front walls 39,40, of the oil baths to control the oil level therein to be below that of the weir edges 11,12. Oil flow over the weir slots 43 enters the gutter 36 and flows via a drain 44 to an oil tank not shown. From here it is pumped continuously to the oil cover 31, whereby the oil circulates continuously, keeping the solder 2 covered at all times and keeping the lower guide rollers $18_1,19_1$ wet with oil from the oil baths 34,35. Solder will collect in the downstream oil bath 35. It is drained therefrom via slots 45 beneath the weir slots 43. Cages 46 are provided in the gutter 36 around the slots 45 to contain solder flowing out of the bores, until it reaches the level of the tops of the cages which are well below the bottom of the lower guide rollers $19_1$. Thus solder in the downstream oil bath drains away from it should its level tend to rise above the cages 46. Oil from the weirs 43 flows onto the cages to prevent solidification of the solder therein. Oil does not flow out through the slots 45, because the barometric head of the oil in the bath is insufficient to depress the level of the dense solder in the bath below the level of the bores 45. An exactly similar arrangement is provided at the upstream oil bath 34 although the solder therein is likely to remain static as little will enter it.

The tinning and levelling operation of the solder leveller will now be described. Via an infeed conveyor—not shown—a board to be tinned approaches the upstream, infeed guide rollers $18_u, 18_l$, is gripped in their nip and passed into the solder bath. It is here passed on the board path 20 through the nips of the tinning rollers which nips are below the solder level 21 and leaves the solder to be gripped by the downstream, outfeed guide rollers $19_u, 19_l$. Both on entering and exiting the bath, the board is wetted with oil both by the guide rollers, the lower ones $18_l, 19_l$, of which run in oil in the baths 34,35 and thus pick up and are coated by oil, and the layer of oil overlying the solder. Downstream of the outfeed guide rollers $19_u, 19_l$ the board is passed between an opposed pair of air knives 47. The strong air flow of these drives excess solder from the bores of the board and off its contact pads. This excess solder forms particles, which are initially liquid drops but can solidify. Due to the thorough wetting of the board with oil, the solder particles encounter oil drops and in collision with them lose momentum and tend not to carry far. The air flow is directed generally towards the outfeed guide rollers. These are castellated, i.e. have a series of smaller diameter portions 48 along their length interspersed between full diameter portions, and so present passages to the air flow and solder particles, much of which latter return to the solder bath. In doing this they are liable to encounter and be further decelerated by oil on the rollers and blown from the rollers in a dispersion of oil in air. The air flow does not impinge on the solder in the bath—and so does not oxidize it—due to the covering of oil 33, indeed the solder remains remarkably dross free. Some of the solder particles will fall into the down-stream oil bath 35, where they collect below the roller $19_l$ as described. The air knives are controlled to operate when the board reaches the nip of the last pair $17_u, 17_l$ of tinning rollers, and for a predetermined time thereafter. For this a transducer 49 detects when the last upper tinning roller lifts with entry of the board into the roller's nip. A hood 37 is arranged over the solder bath 1 and provided with cyclone separators 38—of the type solder under the FLUIDEX trade mark—to separate oil and return it to the bath. In front of the separators 38, a mesh screen 50 is provided to spread the air flow to the separators. Air is withdrawn from the hood 37.

Figure 3:
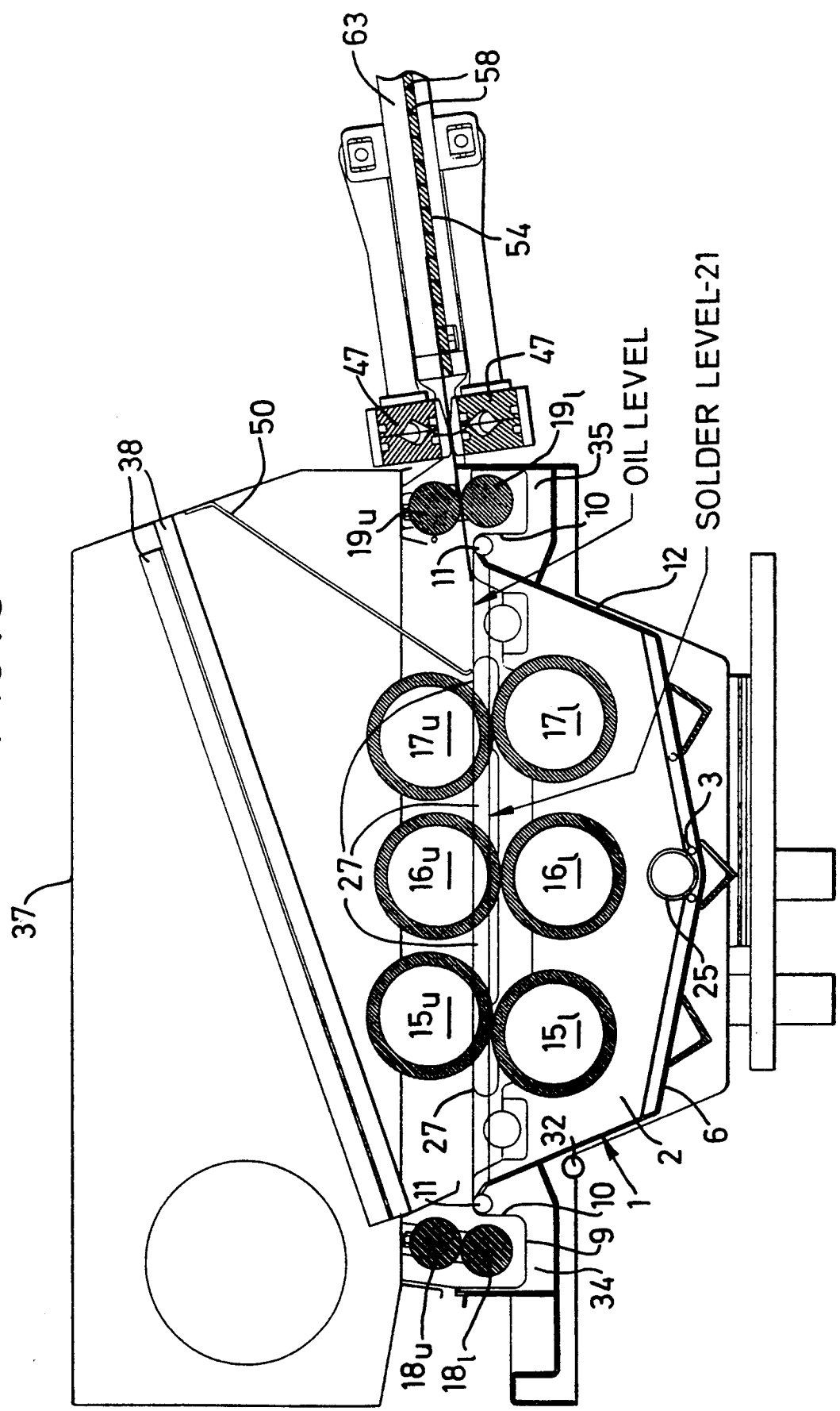
FIG. 3 is another cross-sectional view similar to that of FIG. 2 taken on the line III—III in FIG. 4, with a cowl over the solder bath shown in position.
Figure 4:
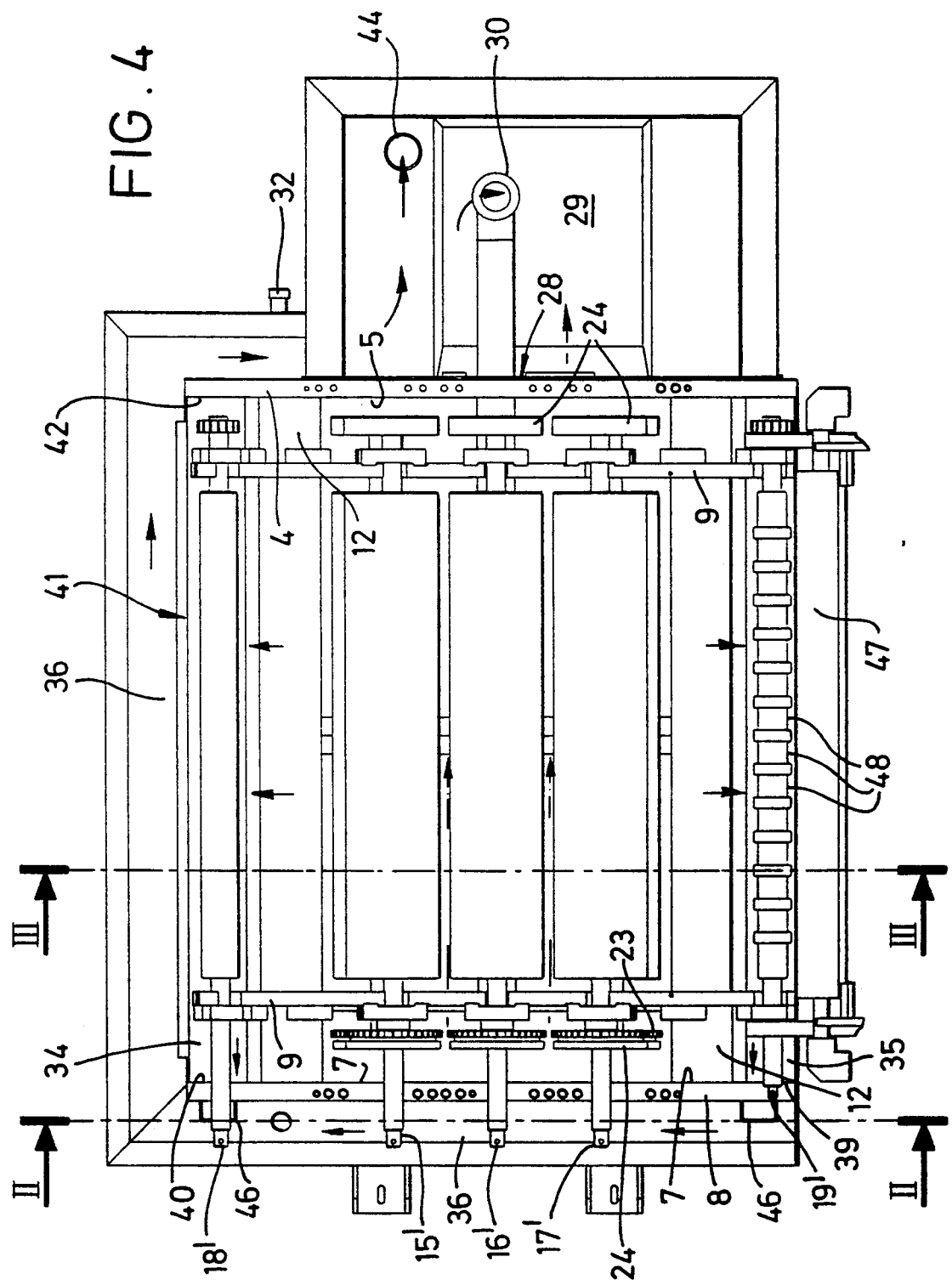
FIG. 4 is a plan view of the leveller, on the scale of FIGS. 2 and 3.
Figure 5:
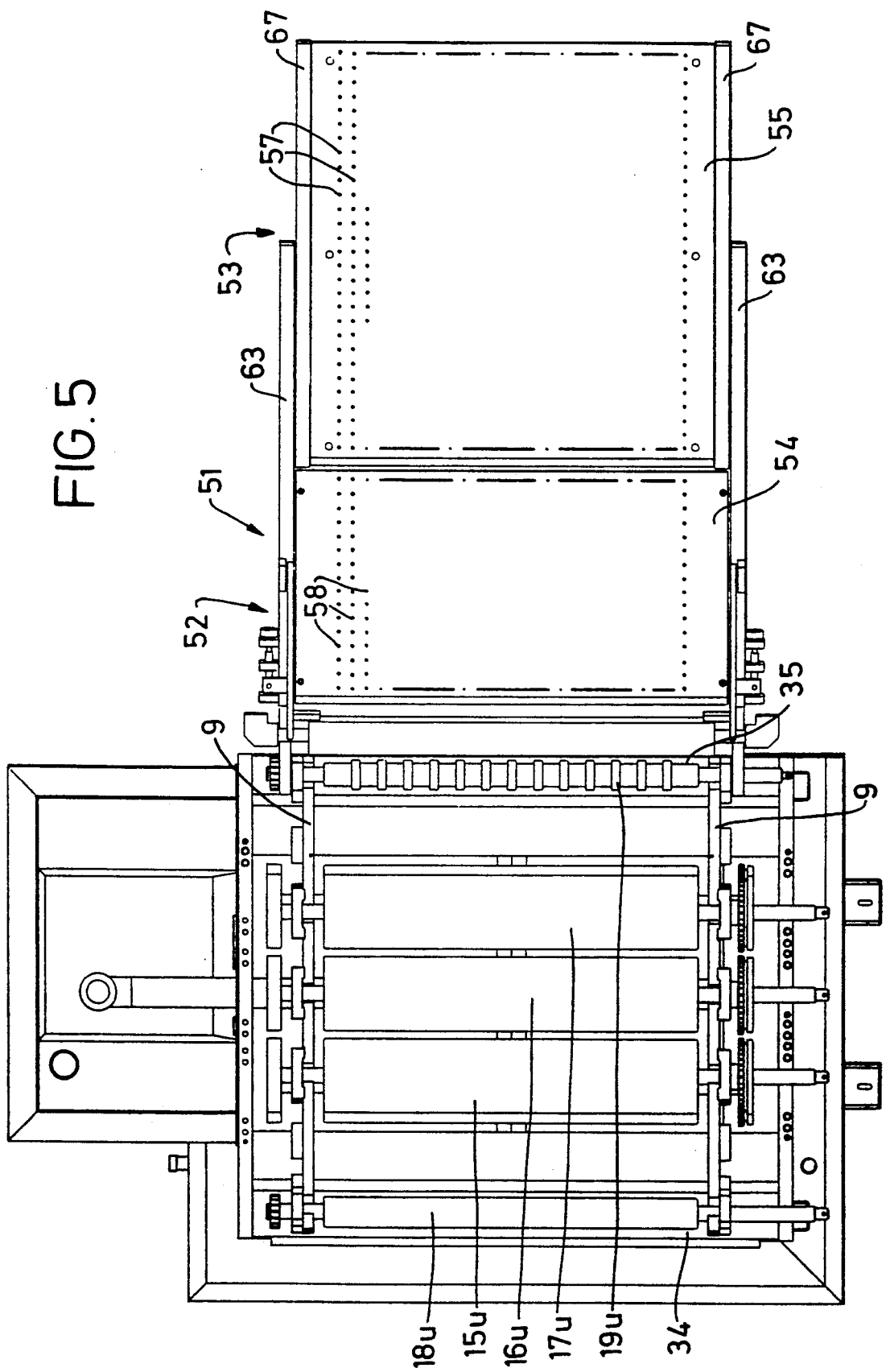
FIG. 5 is another plan view of the leveller, on the scale of FIG. 1 and showing an inclinable air table.
Figure 6:
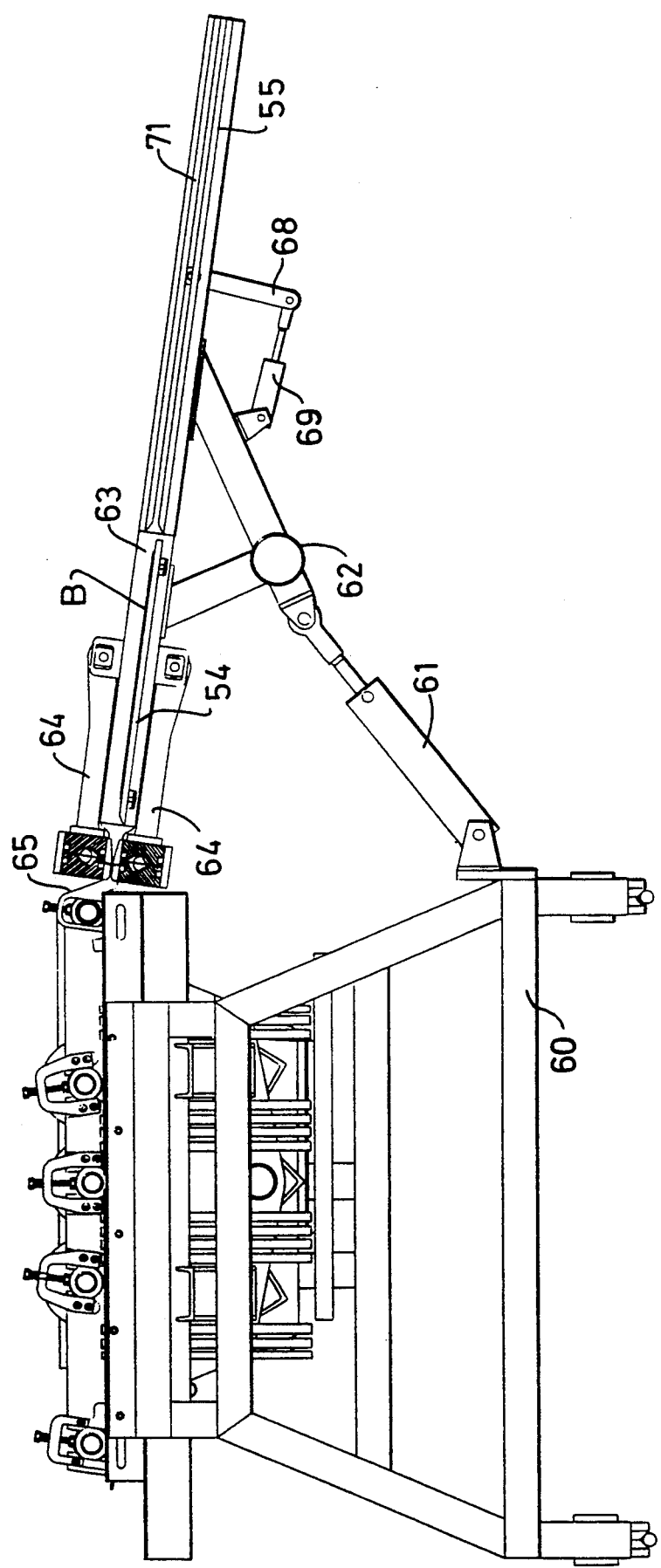
FIG. 6 is a view similar to FIG. 1, with the air table sectioned and in its position having received a levelled board.

Turning now to FIGS. 5 to 9, from the air knives 47, the board passes onto an air table 51. This comprises up- and down-stream portions 52,53 each having a bed 54,55 beneath which is a plenum chamber 56,57 (see FIG. 9). Air passes from the latter through the beds via an array of nozzle bores 58,59. The air jets from the nozzles support the board to prevent it from contacting the beds. Initially, as shown in FIG. 3, the beds 54,55 are oriented for passage of the board along a plane generally defined by the nip of the last tinning rollers $17_u, 17_l$, and the nip of the outfeed rollers $19_u, 19_l$. However as the board passes from the nip of the outfeed rollers, it may lack sufficient momentum to pass through the air knives. To overcome this problem, the entire assembly of the upper outfeed roller $19_u$, the air knives 47, and the air table 51 is pivotally mounted about the axis of the lower outfeed roller 19. This arrangement will now be described.

The entire bath 1 is mounted on a trolley 60. On the down-stream side of the trolley, a pneumatic actuator 61 is pivotally mounted and connected at its upper end to a triangulated support 62 for the bed 54, the support 62 having side arms 63. The air knives 47 are mounted on the support arms 63 via pivot arms 64, which facilitate adjustment and pivotal withdrawal for service of the air knives. The plenum chamber 56 is also mounted on the support 62 between the arms 63. A pair of pivot brackets 65 connects the air-knife end of the support arms 63 to the lower outfeed roller $19_l$ at terminal shaft portions of the latter. The upper outfeed roller $19_u$ is directly carried on the brackets 65. At the opposite end of the support arms 63, there is pivotally connected a further pair of side arms 67, for the bed 55 and the plenum chamber 57. A pair of levers 68 are welded to the underside of the support arms 67. A further pair of pneumatic actuators 69 are connected between the support 62 and the levers 68, for controlling the inclination of the bed 55 with respect to the bed 54.

Figure 7:
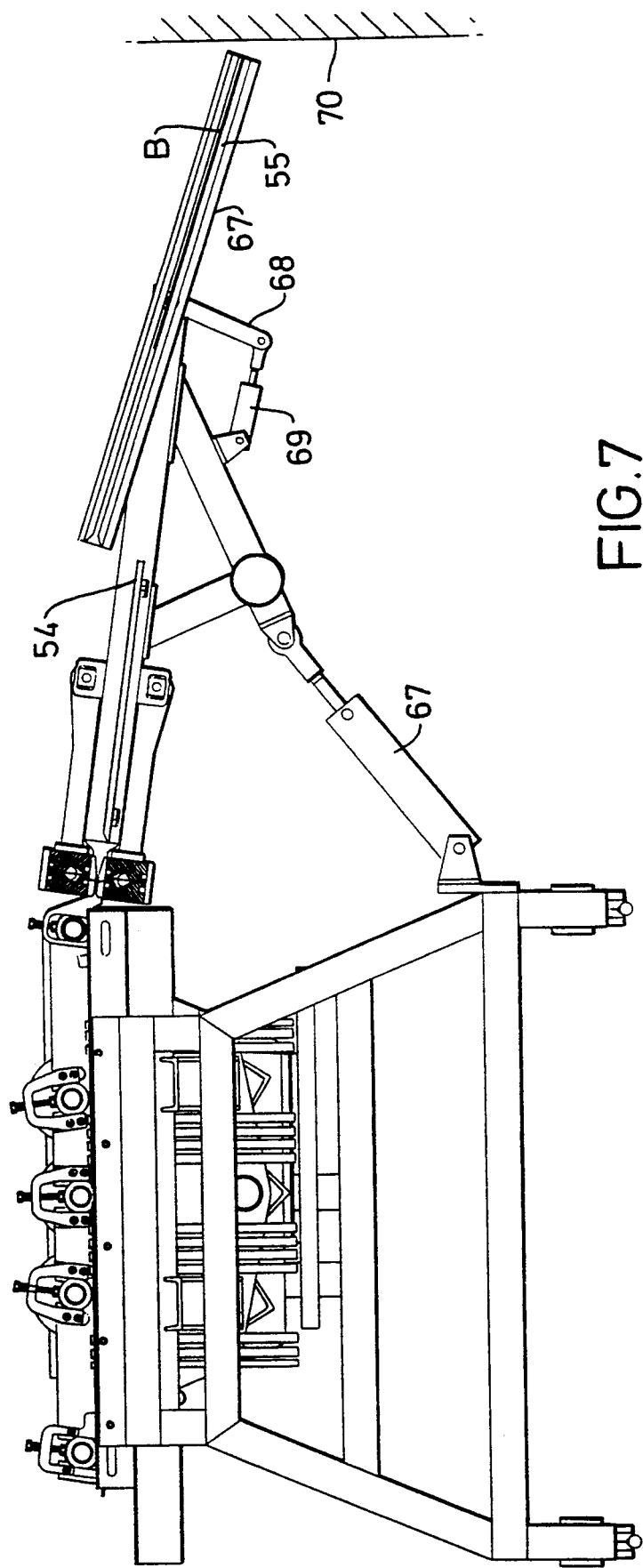
FIG. 7 is a view similar to FIG. 6 with a second air bed of the air table swung prior to lifting for delivering the board to the next station.

Operation of the air table 51 will now be described. When a board being tinned reaches the last of the tinning rollers $17_u, 17_l$, the air knives are started as described above. The air flow at first operates merely to disperse oil from the outfeed rollers $19_u, 19_l$. The board quickly reaches the air knives and is fed onto the first bed 54 of the air table 51, which is in the FIG. 3 position. The air jets from the nozzles 58 support the leading edge of the board as it moves onto the table. As shown in FIG. 3, the nozzles of the bed 54 are oriented to urge the board forward from the air knives. As soon as the trailing edge of the board leaves the tinning rollers $17_u, 17_l$, the actuator 61 is operated to incline the air table 51 down to its FIG. 6 position. The board remains for the time being in the nip of the outfeed rollers $19_u, 19_l$ as the table 51 is dropped, with the result that the trailing edge of the board is lifted, whilst still gripped and driven forward by these rollers through the air knives which remain operating whilst being moved. By the time the trailing edge passes out of the outfeed rollers, the table 51 has been lowered to the position of the bed 54 in FIG. 6—with the beds 54,55 still aligned. After a time determined by the length of the board and its speeds over the table (which is dependent upon its momentum, slowed by the air knives, and gravity), the second bed actuators 69 are activated to tip the bed 55 to a steeper angle as shown in FIG. 7. This ensures that the board runs down into contact with a stop 70 surface provided on the next machine down-stream. To decelerate the board as it approaches the stop surface, the nozzles 59 of the bed 55 are directed oppositely from the nozzles 58 of the bed 54.

Figure 8:
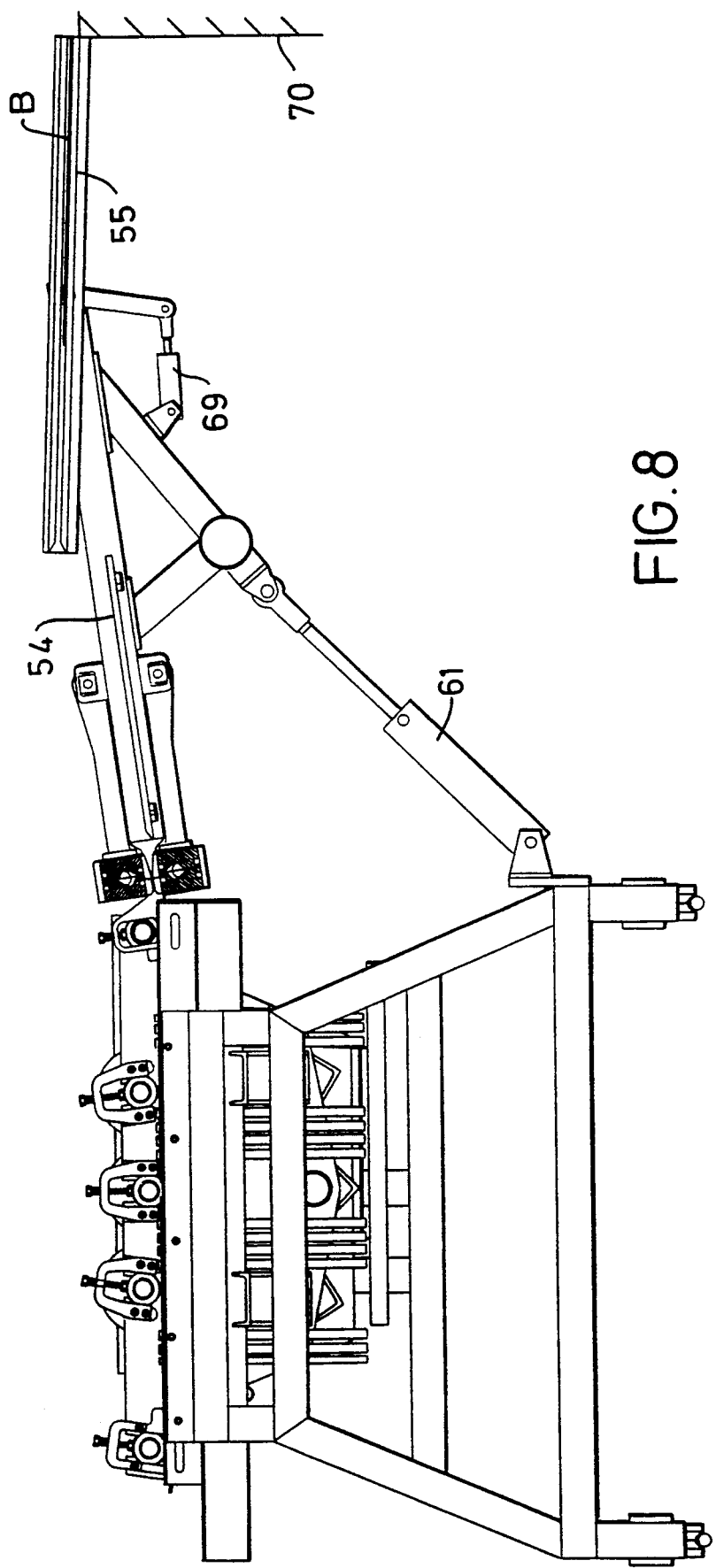
FIG. 8 is a view similar to FIG. 6 of the air table in its position for delivering the board to the next station.
Figure 9:
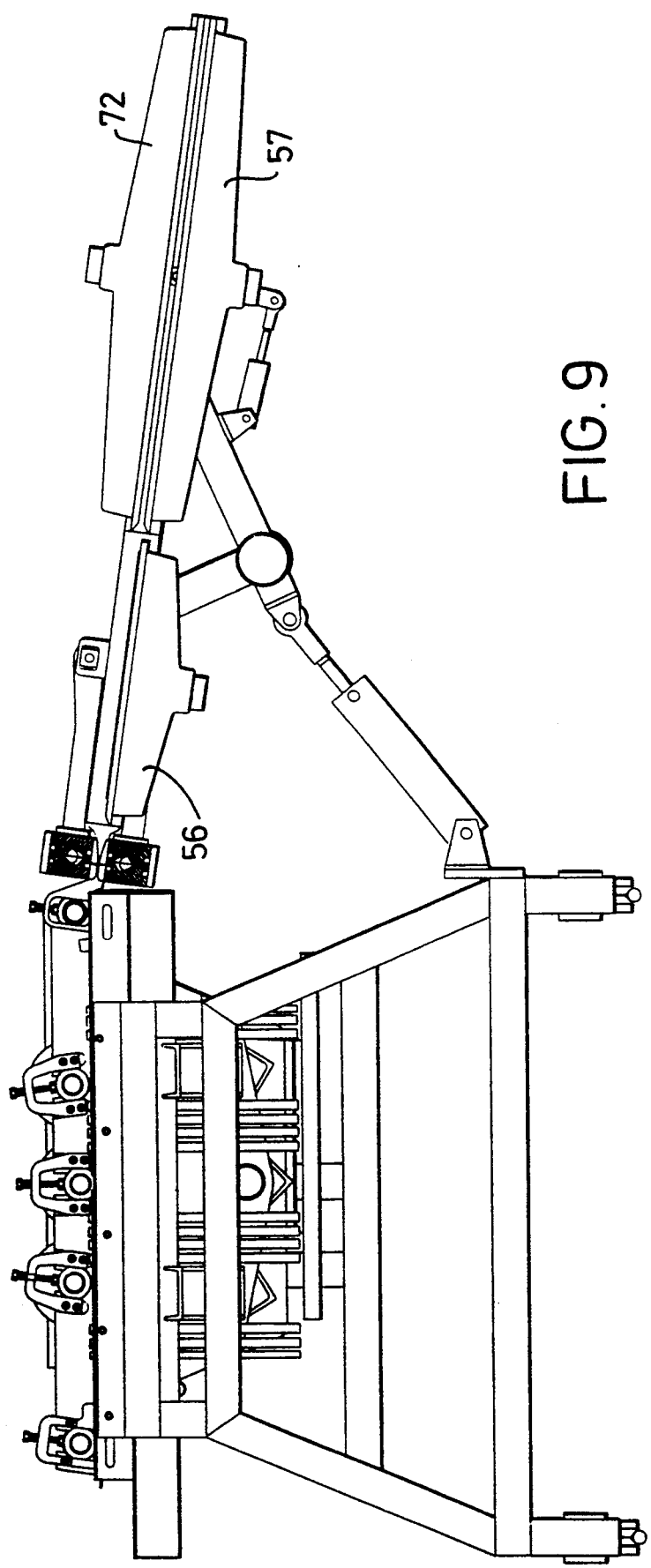
FIG. 9 is a view similar to FIG. 6 showing plenum chambers for the air beds of the air table.

With the second bed 55 held inclined downstream, the first actuator is activated again to bodily lift the air table to its FIG. 8 position, in which the board can run off the table 55 into the next machine. The next board can be received into the nip of the outfeed rollers, where the boards are long, before the second bed 55 is returned into line with the first by the actuators 69 to revert to the FIG. 1 position.

The invention is not intended to be restricted to the details of the above described horizontal solder leveller. Provision is made on the support plates 8 for support of guide rollers immediately up- and down-stream of the tinning rollers. FIGS. 6 to 9 show an optional upper air bed 71 and plenum chamber 72 over the bed 55 to provide additional braking for the board as it approaches the stop 70. The bed 71 has nozzles directed back upstream as the nozzles 59 of the bed 55.

Figure 10:
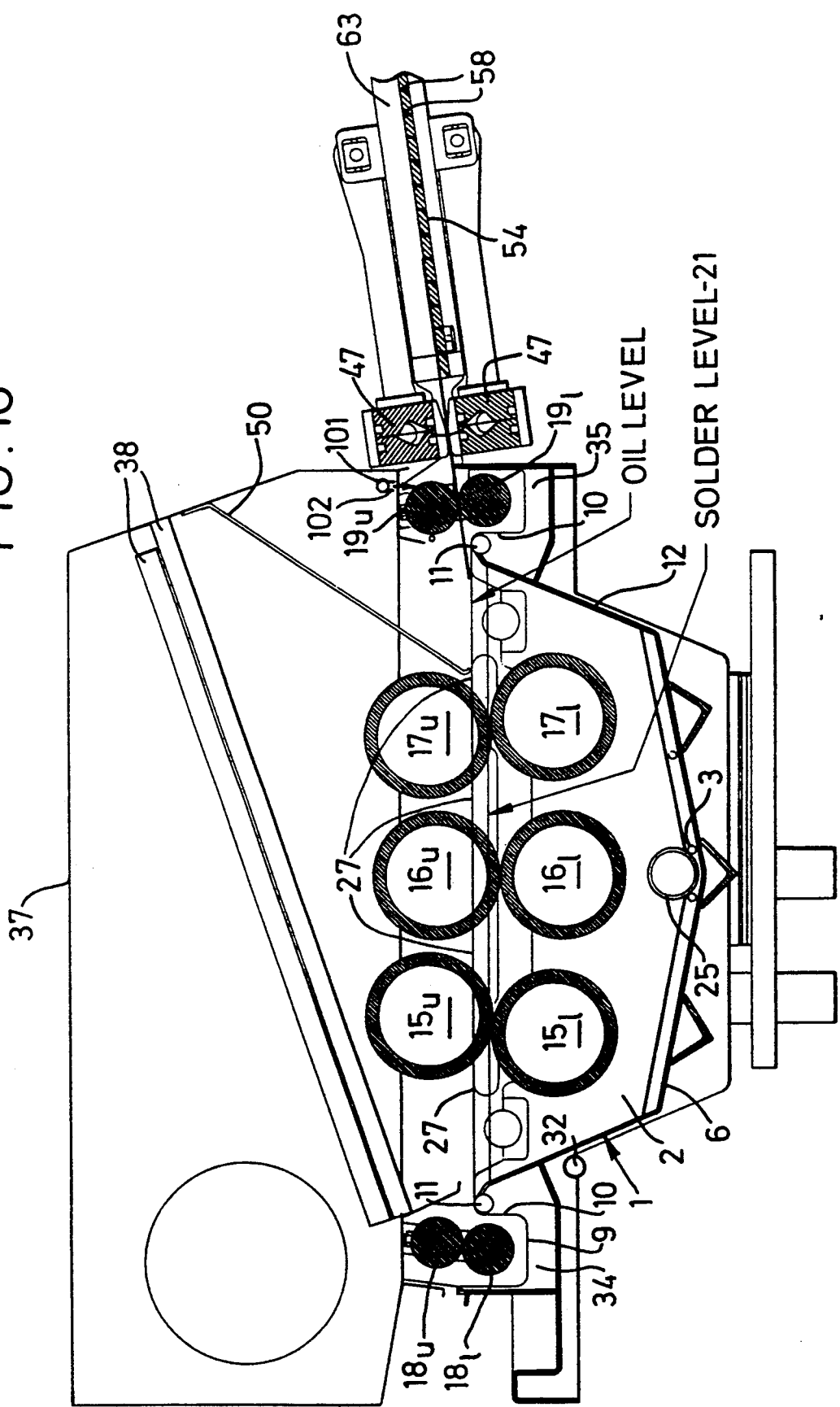
FIG. 10 is a view similar to FIG. 3 of a variant of the solder leveller of FIG. 1.

The varied solder leveller shown in FIG. 10 has a spurge bar 101 positioned above the board path immediately downstream of the outfeed rollers. The bar has a series of downwardly directed nozzles 102, from which a curtain of oil is pumped in operation. The oil becomes dispersed in the air stream from the air knives.

Levellers configured to have other solder application arrangements, particularly with a planar board path, can be envisaged to benefit from oil dispersion between the solder application means and the solder levelling means, and from a moving, downstream air table.

I claim:

1. A horizontal solder leveller for applying solder to a board comprising:
   means including a solder bath for applying molten solder to a board;
   means for levelling solder applied to the board, including nozzles for directing solder-levelling air jets at the board; and
   means for creating a dispersion of oil in an air stream from the levelling means, the oil dispersion means being provided between the solder applying means and the levelling means.

2. A horizontal solder leveller as claimed in claim 1, including a pump for directly or indirectly pumping oil to the means for creating an oil dispersion.

3. A horizontal solder leveller as claimed in claim 2, wherein the oil dispersion means comprises a pipe having oil dispersion nozzle(s) from which a spray or curtain of oil can be pumped directly into the airstream by the oil pump therefor.

4. A horizontal solder leveller as claimed in claim 1, including a pair of outfeed rollers having a nip therebetween for guiding the board between the solder applying means and the levelling means, one, the other or both of the outfeed rollers being castellated having a series of smaller diameter portions between full diameter portions for passage of air past it.

5. A horizontal solder leveller as claimed in claim 4, including an oil bath in which the lower one of the outfeed rollers is at least partially immersed, in use the lower roller being constantly wetted with oil from the oil bath and the oil being dispersed at the castellations which allow passage for the air stream from the nozzles.

6. A horizontal solder leveller as claimed in claim 4, wherein both the outfeed rollers are castellated.

7. A horizontal solder leveller as claimed in claim 5, wherein a weir is provided to allow oil to flow from the solder bath to the oil bath for the lower outfeed roller and the oil pump is arranged to pump the oil to the solder bath.

8. A horizontal solder leveller as claimed in claim 7, including:
   a gutter for draining oil from the oil bath to an oil tank,
   a further weir in a wall of the oil bath to control the oil level therein to be below that of the weir between the solder bath and the oil bath,
   a solder aperture in the oil bath wall beneath the further weir for draining solder from the oil bath, and
   a cage in the gutter around the solder aperture to contain solder flowing out of the aperture with a top edge higher than the solder aperture, whereby solder contained by the cage fills the aperture and closes it to oil flow.

9. A horizontal solder leveller as claimed in claim 1, wherein the solder applying means includes at least one pair of the tinning rollers arranged with their nip beneath the use level of the solder in the solder bath.

10. A horizontal solder leveller as claimed in claim 7, wherein a weir is provided to allow oil to flow from the solder bath to the oil bath for the lower outfeed roller and the oil pump is arranged to pump the oil to the solder bath, the leveller including:
    an oil cover over gear wheel(s) drivingly connecting upper tinning roller(s) to lower tinning rollers, the cover having aperture(s) for shaft(s) of the upper tinning rollers and extending below the level of the solder in the bath, and
    an oil supply duct to the oil cover from the oil pump, the oil spilling out of the cover into the solder bath via the shaft apertures.

11. A horizontal solder leveller as claimed in claim 1, including a cowl over the solder bath to direct dispersed oil back into the solder bath.

12. A horizontal solder leveller as claimed in claim 11, wherein the cowl includes an oil separator for separating oil from the air stream within the cowl.

13. A horizontal solder leveller as claimed in claim 9, wherein the tinning rollers are provided with coaxial wheels having a slightly larger diameter than their rollers to provide a small gap between the tinning rollers.

14. A horizontal solder leveller as claimed in claim 9, including;
    front and rear support plates for the rollers spaced from front and rear walls of the solder bath, the support plates having solder apertures at the use level of the solder in the bath,
    solder ducting for leading solder to the space between the front wall and the front support plate,
    a solder outlet at the back wall,
    a solder tank for receiving solder from the outlet, and
    a pump for pumping solder from the tank to the ducting.

15. A horizontal solder leveller as claimed in claim 1, including means for changing the inclination of the board as it leaves the levelling means from a substantially horizontal or upwards inclination to a downwards inclination.

16. A horizontal solder leveller as claimed in claim 15, wherein the inclination changing means includes an air table along which the board travels downstream of the levelling means, the inclination changing means being adapted to change the inclination of the air table.

17. A horizontal solder leveller as claimed in claim 15, including a pair of outfeed rollers having a nip therebetween for guiding the board between the solder applying means and the levelling means, one, the other or both of the outfeed rollers being castellated having a series of smaller diameter portions between full diameter portions for passage of air past it, wherein the inclination changing means includes a frame, the frame is pivotally connected to the solder bath about the central longitudinal axis of the lower outfeed roller.

18. A horizontal solder leveller as claimed in claim 16, wherein the air table is provided in two parts, the first part of the air bed is fixedly carried on the frame, the second part of the air table is pivotally carried on the frame, whereby the second part can be more steeply inclined than the first part to urge the board to travel by gravity to its downstream end.

19. A horizontal solder leveller as claimed in claim 16, wherein the upper outfeed roller is carried on the frame.

20. A horizontal solder leveller as claimed in claim 15, wherein the levelling means is carried on the frame.

21. A horizontal solder leveller comprising:

means including a solder bath for applying molten solder to a board;

means for levelling solder applied to the board, including nozzles for directing solder-levelling air jets at the board; and means for changing the inclination of the board as it leaves the levelling means from a substantially horizontal or upwards inclination to a downwards inclination.

* * * * *